(12) United States Patent
Togawa et al.

(10) Patent No.: US 7,808,814 B2
(45) Date of Patent: Oct. 5, 2010

(54) MAGNETIZATION STATE CONTROL DEVICE AND MAGNETIC INFORMATION RECORDING DEVICE

(75) Inventors: Yoshihiko Togawa, Wako (JP); Ken Harada, Wako (JP); Tsuyoshi Matsuda, Wako (JP); Yoshichika Otani, Wako (JP); Takashi Kimura, Wako (JP)

(73) Assignee: Riken, Saitama (JP)

( * ) Notice: Subject to any disclaimer, the term of this patent is extended or adjusted under 35 U.S.C. 154(b) by 172 days.

(21) Appl. No.: 12/219,238

(22) Filed: Jul. 17, 2008

(65) Prior Publication Data

US 2009/0021866 A1   Jan. 22, 2009

(30) Foreign Application Priority Data

Jul. 17, 2007  (JP) .............................. 2007-186095

(51) Int. Cl.
*G11C 11/02* (2006.01)
(52) U.S. Cl. ..................... 365/158; 365/148; 365/171
(58) Field of Classification Search ................. 365/213
See application file for complete search history.

(56) References Cited

U.S. PATENT DOCUMENTS

| | | | |
|---|---|---|---|
| 5,870,328 A * | 2/1999 | Mohri | 365/135 |
| 6,509,621 B2 * | 1/2003 | Nakao | 257/421 |
| 6,950,335 B2 * | 9/2005 | Dieny et al. | 365/171 |
| 7,221,583 B2 * | 5/2007 | Ikeda | 365/158 |
| 7,257,018 B2 * | 8/2007 | Ho et al. | 365/158 |
| 7,457,149 B2 * | 11/2008 | Ho et al. | 365/158 |
| 7,480,175 B2 * | 1/2009 | Dieny et al. | 365/171 |

* cited by examiner

*Primary Examiner*—Tan T. Nguyen
(74) *Attorney, Agent, or Firm*—Nixon & Vanderhye P.C.

(57) ABSTRACT

The magnetization state of a ferromagnetic material is controlled by applying a current pulse to it while externally applying a weak magnetic field to it. The magnetic state of a ferromagnetic material can be switched between a uniformly magnetized state and a multiple magnetic domain structure by controlling the direction and intensity of the magnetic field applied to it and the intensity and pulse width of the current pulse. When an external magnetic field is applied, the possibility of occurrence of the reversal of the magnetic state upon application of the current pulse shows a hysteresis, and the reversal of the magnetic state can be controlled reliably. The intensity of the magnetic field to be applied may be as weak as a few gauss. Furthermore, by using such magnetic information recording elements, a magnetic information recording device (memory) that can achieve a high degree of integration can be produced.

9 Claims, 18 Drawing Sheets $i_p$ : CURRENT PULSE

PULSE WIDTH

MAGNETIZATION STATE CONTROL DEVICE AND MAGNETIC INFORMATION RECORDING DEVICE

This application claims priority to Japan Application No. 2007-186095, filed 17 Jul. 2007, the entire contents of each of which are hereby incorporated by reference.

BACKGROUND OF THE INVENTION

1. Field of the Invention

The present invention relates to a magnetization state control device and a magnetic information recording device that controls a magnetic state of a magnetization material by current drive.

2. Description of the Related Art

In recent years, various information recording elements that operate based on novel operation principles have been developed. In particular, technical fields pertaining to various elements that utilize spin characteristics of electrons have been receiving attention as new development in the field of electronics and eventually established as a new independent field, which is referred to as spintronics. In particular, studies of magnetization reversal in a magnetic material element caused by injecting a spin-polarized current have been attracting much attention for a variety of possible applications.

The technology of magnetization reversal by spin-polarized current is gathering attention for the following reason. In the case of methods of magnetization reversal using an external magnetic field like those used in the existing magneto-resistive random access memory (MRAM), miniaturization of the element leads to an increase in the intensity of the magnetic field required to reverse the magnetization. In addition, the magnetic field exhibits a long range interaction by its nature. In view of these, it is considered that increasing the capacity of the existing MRAM while using an external magnetic field as means for creating a reversely magnetized region will reach the limit sooner or later.

For the above described reason, magnetization reversal by spin-polarized current injection have been intensively studied as a method that can remove the aforementioned limit. In the late 1990s, magnetization reversal at low temperatures in a three-layered film was confirmed by experiments (see E. B. Myers et al., "Current-Induced Switching of Domains in Magnetic Multilayer Devices", Science. Vol. 285, (1999) 867, (non-patent literature 1)), which is followed by confirmation of magnetization reversal at room temperatures in a giant magneto-resistance (GMR) film in the 2000s (see J. A. Katine et al., "Current-Driven Magnetization Reversal and Spin-Wave Excitations in Co/Cu/Co Pillars", Phys. Rev. Lett. Vol. 84, (2000) 3149 (non-patent literature 2)). Thus, studies aiming at practical implementation of this technology have been intensively conducted mainly in the Europe and the United States. However, with increases in the degree of integration, problems such as increased complexity of the element structure are beginning to be encountered.

In the following, an information recording method and reading method using a uniformly magnetized structure/reversely magnetized structure will be described taking a MRAM as an example.

<Writing of Information>

A TMR (Tunneling Magneto-Resistance) element that constitutes a MRAM has a three-layer structure in which an insulator thin film having a thickness of a few layers of atoms is sandwiched between two ferromagnetic thin films. In this device, while the direction of the electron spin in one of the ferromagnetic thin films is fixed, the direction of electron spin in the other ferromagnetic film can be changed by a magnetic field that is externally applied thereto. In the device, the state in which the electron spins in the both films are parallel is associated, for example, with "0", and the state in which the electron spins are antiparallel is associated with "1". Thus, information can be recorded by controlling the direction of the electron spin (i.e. the magnetization state) in the ferromagnetic thin film that is not fixed.

<Reading of Information>

Reading of information in the MRAM is performed utilizing the characteristic of the TMR element that its electric resistance changes depending on the difference in the directions of electron spins. When the directions of the electron spins in the two ferromagnetic thin films in the TMR element are parallel, the resistance of the TMR becomes relatively small. In contrast, when the directions of the electron spins are antiparallel, the resistance becomes relatively large. Therefore, the spin state of the TMR element can be known by detecting the change in the value of the resistance.

The address access time of the MRAM is 10 to 20 ns and the cycle time thereof is 20 to 30 ns, which are approximately five times those of the DRAM (Dynamic Random Access Memory). Thus, high speed writing and reading on par with SRAM (Static Random Access Memory) can be achieved. In addition, the MRAM is advantageous in that the power consumption is as small as approximately one-tenth that of the Flash memory, and that it can be integrated to a high degree.

Recently, a concept of a racetrack type magnetization information recording device (or racetrack random access memory) was made public (see U.S. Pat. No. 6,834,005 (patent literature 1) and "Spintronics Devices Research: Magnetic Racetrack Memory Project", IBM, available online at the URL of <http://www.almaden.ibm.com/spinaps/research/sd/?racetr ack> (non-patent literature 3)). In this device, a magnetic material that is large enough to contain a plurality of magnetic domain structures is prepared as an information recording section (in the form of, for example, a tape) instead of handling a single ferromagnetic structure as a single memory element, and reversely magnetized states are written in the information recording section. This is based on a concept similar to the magnetic tape, but what is fundamentally different is that unlike with recording/reading using a magnetic tape in which a recording head or the magnetic tape is moved to make access to adjacent recorded information, the reading and recording portions are mechanically fixed in this device, and a magnetization state recorded in the magnetic material is driven by a spin-polarized current to move the position of a magnetic domain so that it is subjected to a recording/reading operation. This is based on a completely novel concept that provides a possibility that a magnetic domain structure as it is in a ferromagnetic material can be used as a bit, which is different from the concept of conventional devices in which each element corresponding to one bit is mechanically fixed and information recording/erasing is individually performed on each of them. Thus, the size corresponding to the distance between adjacent elements in conventional devices is decreased to the size of adjacent magnetic structures, whereby ultimate size reduction is achieved. Therefore, an increase in the integration density and resultant performance of high calculation speed are expected.

The present invention has been made based on experiments for generating a reversely magnetized region by current pulse supply to a ferromagnetic material in a weak magnetic field that were performed based on the above described background (see Y. Togawa et al., "Current-Excited Magnetization Dynamics in Narrow Ferromagnetic Wires", Japan. J. Appl. Phys. Vol. 45, (2006) L683 (non-patent literature 4) and Y. Togawa et al., "Domain Nucleation and Annihilation in Uniformly Magnetized State Under Current Pulses in Narrow Ferromagnetic Wires", Japan. J. Appl. Phys. Vol. 45, (2006) L1322 (non-patent literature 5)).

In conventional magnetic information recording element such as MRAM, information is recorded as a state of magnetization formed in a ferromagnetic material in the element. To control the magnetization state, a magnetic field is applied externally to the element, whereby reversal of magnetization and formation of multiple magnetic domain structures etc. are caused reflecting the intensity of the magnetic field. In the case where magnetization reversal is to be caused by applying a magnetic field, miniaturization of the element requires an increase in the intensity of the magnetic field to be applied. Thus, we face the technical difficulty of applying an intense magnetic field to a very small region. This has been one of the obstacles to high density integration.

Furthermore, since the effect of magnetic field reaches infinity by its nature, if the integration density is made high, there is a possibility that a magnetic field generated to control a certain element disturbs the magnetization state of an adjacent element. This has also been another obstacle to high density integration.

In contrast, in the method using spin-polarized current injection, these problems can be eliminated. For example, Japanese Patent Application Laid-open No. 2006-196708 (patent literature 2) teaches to increase the amount of electric current supplied to a magnetic information memory element beyond a certain critical electric current amount by arranging the shape and material of the element. Thus, a method of recording/erasing information using a magnetic domain structure (or magnetization state) spontaneously formed upon current supply has been developed.

In the method using spin-polarized current, however, it is considered to be difficult to control the magnetization state reliably. In particular, in the operation of actual elements, there is a possibility that both the information recording operation and information erasing operation become unstable, because these operations depend only on control of the amount of electric current to be supplied.

SUMMARY OF THE INVENTION

The present invention has been made in view of the above described problems and has as an object to provide a technology that enables high density integration and stable control of the magnetization state of a magnetic material.

To achieve the above object, according to the present invention, there is provided a magnetization state control device that supplies a current pulse to a magnetic material (ferromagnetic material) that constitutes a magnetic information recording element or the like while applying a magnetic field to it, thereby recording/erasing magnetic information. By adjusting the intensity and direction of the external magnetic field applied to the magnetic material, occurrence of magnetization reversal in the magnetic material caused by the current pulse can be made stable.

The externally applied magnetic field that is needed in the device according to the present invention is a weak magnetic field having an intensity of a few gauss (G). The magnitude of this magnetic field is sufficiently larger than the magnetic field that is constantly existing in the device due to environmental causes such as the geomagnetic field (which is approximately 0.15 G) but may be significantly smaller than the magnetic field that causes magnetization reversal (which is approximately 100 G, though it varies depending on the material and shape). By applying a current pulse while applying a magnetic field in a direction antiparallel to (i.e. opposite to) the direction of magnetization of the ferromagnetic material in the element, a reversely magnetized structure can be formed. On the other hand, by supplying a current pulse while applying a magnetic field in a direction parallel to (i.e. the same as) the direction of magnetization of the ferromagnetic material in the element, magnetic reversal can be prevented or a reversely magnetized structure can be erased.

As per the above, since the magnetic field to be applied may be weak, equipment for applying a required magnetic field can be easily produced. In addition, since control of the magnetization state (i.e. recording and erasing of information) can be performed with a magnetic field with a magnitude significantly smaller than the magnitude of the magnetic field that causes magnetization reversal only by application of the magnetic field, the magnetic field can be prevented from affecting adjacent elements upon control. Thus, a high degree of integration can be achieved.

According to the present invention, the magnetization state is controlled using two independent parameters, namely the external magnetic field and the current pulse. Therefore, a higher degree of stability in operation can be achieved as compared to the device disclosed in the above mentioned patent literature 2 in which operation is controlled based only on the current intensity.

If a high degree of integration of magnetic information recording elements is to be achieved, it is preferred that a current pulse for recording/erasing magnetic information can be applied to each of the elements individually while applying a uniform magnetic field to all of the integrated elements. This also enables simultaneous control of magnetization states of a plurality of elements. In addition, this is advantageous in increasing the degree of integration, since it is not needed to provide more than one magnetic field applying means.

It is also preferred that the magnetic field applying means include first magnetic field applying means for applying a uniform magnetic field to the entire device and a plurality of second magnetic field applying means each of which applies a magnetic field individually to a portion (one or some) of the elements. This advantageously improves the operation speed in information recording/erasing.

According to the present invention, the magnetization state of a magnetic material can be controlled with improved reliability, and high degree of integration can be achieved.

BRIEF DESCRIPTION OF THE DRAWINGS

FIG. 1A shows a uniformly magnetized state, and FIG. 1B shows a reversely magnetized state.

FIG. 2A shows a case in which a ferromagnetic material has notches, FIG. 2B shows a case in which a ferromagnetic material has bends, and FIG. 2C shows a case in which different ferromagnetic materials are used.

FIG. 3A shows a uniformly magnetized state, and FIG. 3B shows a reversely magnetized state.

FIG. 4A shows a initial, uniformly magnetized state, FIG. 4B shows current pulse supply to the initial state, FIG. 4C shows formation of a reversely magnetized state, FIG. 4D shows cancellation or erasing of the reversely magnetized state (by reversing the direction of an external magnetic field), and FIG. 4E shows a uniformly magnetized state after the cancellation.

FIG. 5A shows the state before current pulse supply, and FIG. 5B shows the state after current pulse supply.

DESCRIPTION OF THE PREFERRED EMBODIMENTS

Principle of Information Recording in Magnetic Information Recording Element

Figure 1A:
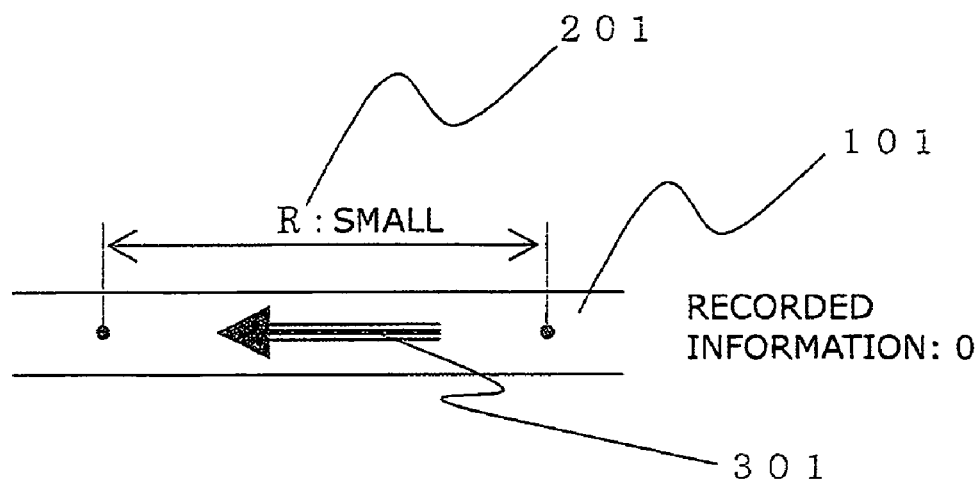
FIGS. 1A and 1B schematically show magnetization states of a ferromagnetic material, where
Figure 1B:
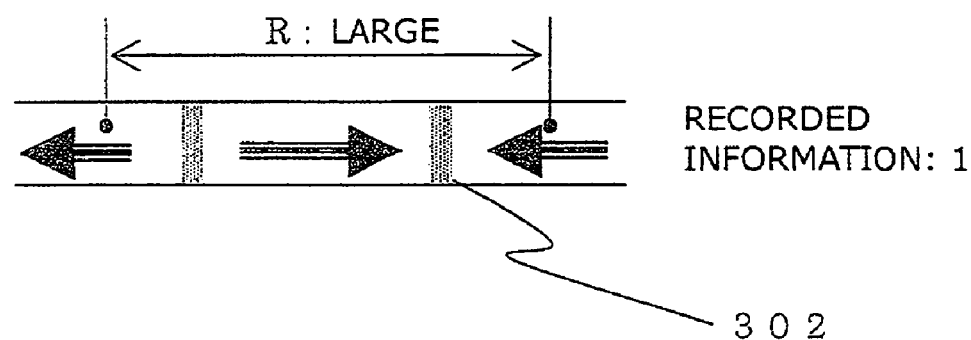

In the following, a principle of recording information in a ferromagnetic material (i.e. magnetic information recording element) will be described. FIGS. 1A and 1B schematically show a uniformly magnetized state (single magnetic domain structure) and a state containing reversed magnetization (multiple magnetic domain structure). While the ferromagnetic material 101 shown in FIG. 1A has a single magnetic domain with a direction indicated by arrow 301, the ferromagnetic material shown in FIG. 1B has multiple magnetic domains partitioned by magnetic domain walls 302. Conventionally, the reversed magnetization shown in FIG. 1B is created by applying a magnetic field locally to the ferromagnetic material 101 that is in a uniformly magnetized state as shown in FIG. 1A from outside. The state of magnetization can be detected based on a change in the value of resistance of the entire element. For example, the state shown in FIG. 1A is logically defined as "0" (erased), and the state shown in FIG. 1B is defined as "1" (recorded), and information is a recorded accordingly.

Figure 2A:
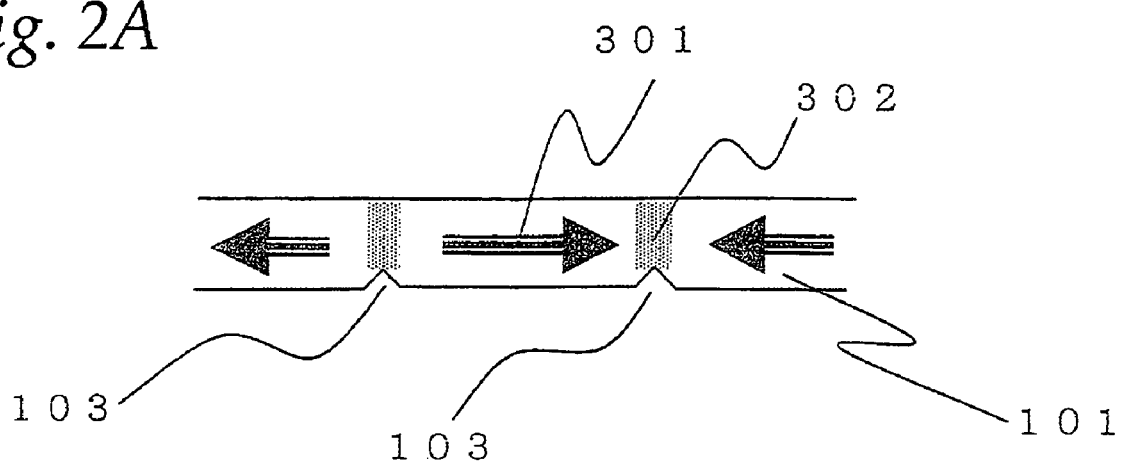
FIGS. 2A to 2C schematically show reversely magnetized states created depending on the shape and material.
Figure 2B:
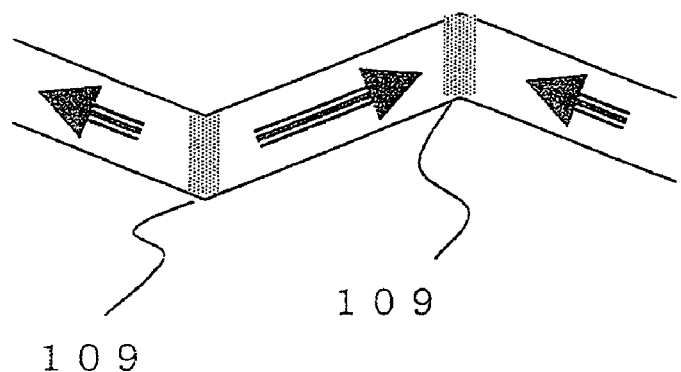
Figure 2C:
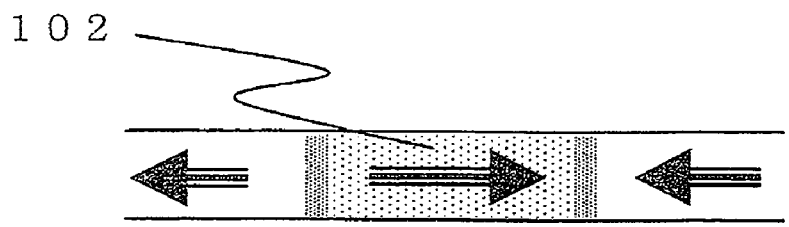

In order to make the operation of magnetization reversal in the ferromagnetic material 101 stable, and in order to make the magnetic domain structure in the ferromagnetic material 101 definite, it is preferred that the ferromagnetic material be designed to have variations in the shape. The variations in the shape may be notches 103 as shown in FIG. 2A, or bends 109 as shown in FIG. 2B. Alternatively, a portion of the ferromagnetic material may be replaced by a different ferromagnetic material 102 as shown in FIG. 2C. In the case where the ferromagnetic material has such variations in the shape or variations in the material (i.e. variations in the magnetic permeability), magnetic reversal is easy to occur with magnetic domain walls being created at the positions of variations. Thus, control of the magnetization state in the element can be performed stably.

Figure 3A:
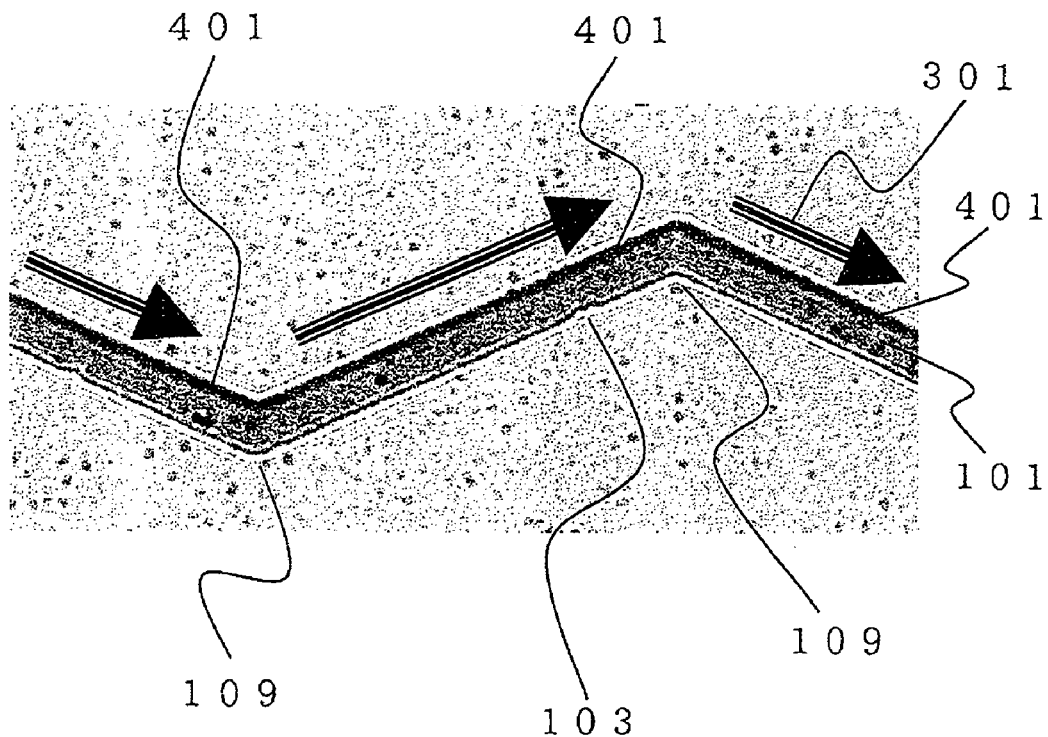
FIGS. 3A and 3B are observed images (by Lorentz microscopy) showing magnetization states of a ferromagnetic material having variations in the shape, where
Figure 3B:
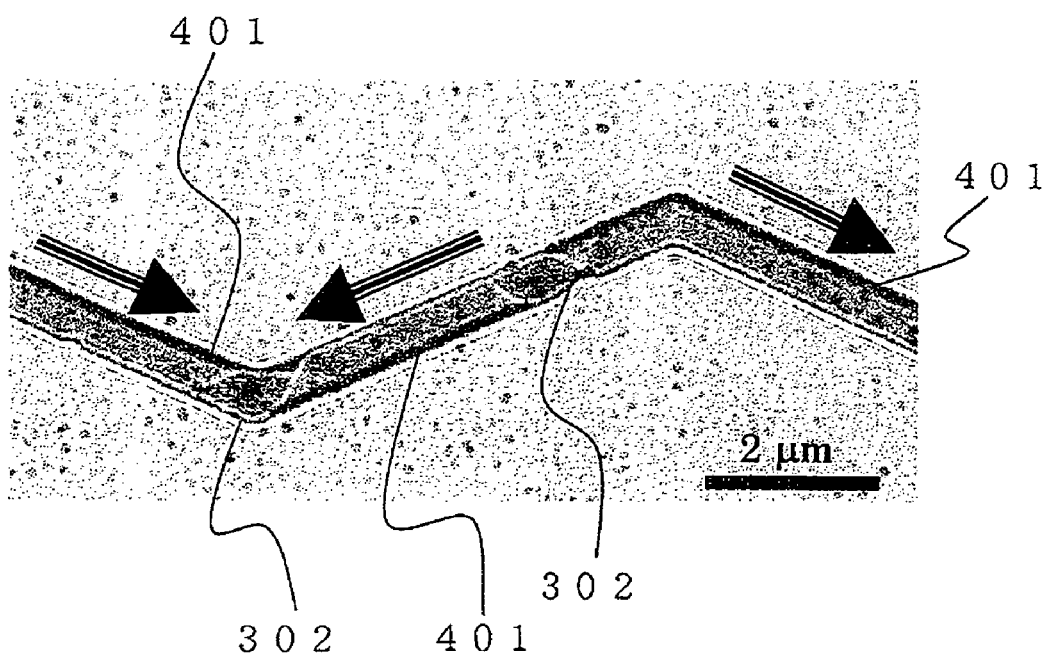

FIGS. 3A and 3B are microscopic observations showing how magnetization reversal occurs. FIGS. 3A and 3B show the result of an experiment and correspond to FIGS. 1 and 2. A sample used was a Permalloy shaped into a thin ribbon having a width of 500 nm (nanometer) and a thickness of 30 nm. The bending angle at the bends 109 was 24 degrees relative to the longitudinal direction. FIG. 3A shows a uniformly magnetized state, and FIG. 3B shows a state containing reversed magnetization. FIGS. 3A and 3B show the result of Lorentz microscopy observation using a transmission electron microscope. In FIGS. 3A and 3B, the direction of magnetization can be known from the position of black lines 401 appearing at the edges of the magnetic thin film ribbon. While in FIG. 3A all the black lines 401 appear on the upper side, the position of the black line 401 in the central portion of the ribbon in FIG. 3B has been changed to the lower side. From this, we can see that a magnetization reversal has occurred in FIG. 3B. The magnetization directions are indicated by arrows in FIGS. 3A and 3B. It is seen from FIG. 3B that magnetic domain walls or boundaries of magnetic domains are formed at the positions of a bend 109 and a notch 103 (which is supposed to be a flaw made during production process of the thin film ribbon).

FIGS. 1 to 3 show exemplary magnetic information recording elements to which control of magnetization state according to the present invention is applied by way of example, and it should be understood that they are not intended to limit the present invention. As will be understood, other elements may also be used as the magnetic information recording element insofar as information can be recorded in them by controlling the magnetization state. For example, the magnetization state of a TMR element or a spin valve may be controlled.

<Operation Principle of the Present Invention>

FIG. 4 illustrates the operation principle of the present invention. A magnetic field 303 having an intensity of a few gauss is applied to a ferromagnetic material 101 that is in a uniformly magnetized state from outside in the direction opposite to the direction of magnetization 301 of the material (FIG. 4A). In this state, a current pulse 202 is supplied (FIG. 4B). Although in the illustrated case a current pulse having the direction same as the direction of magnetization of the single magnetic domain in the ferromagnetic material 101 is supplied, the current pulse may be supplied in either direction. If the intensity and pulse width of the current pulse 202 are selected appropriately, a reversely magnetized region is formed in the ferromagnetic material 101 (FIG. 4C). The position at which the reversely magnetized region is formed can be controlled by designing the shape or other properties of the ferromagnetic material 101 as has been described above (with reference to FIG. 2).

The reversely magnetized structure can be formed only by supplying a current pulse without applying the external magnetic field 303. In this case, however, stable creation of the reversely magnetized structure upon current pulse supply is not assured (see non-patent literature 5 referred to before). The reversely magnetized state can also be formed by applying an external magnetic field 303 having an intensity of approximately 100 gauss. In this case, however, another technology is required to generate a strong magnetic field locally, which is disadvantageous in achieving high integration density.

Figure 4A:
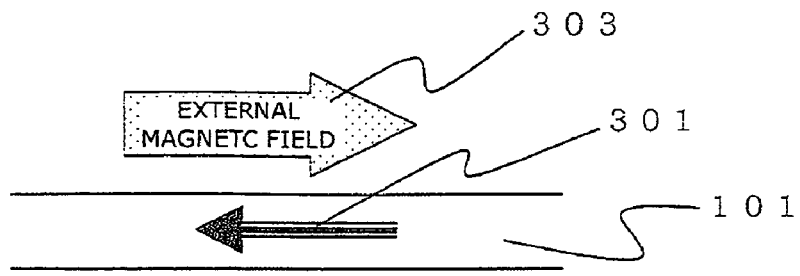
FIGS. 4A to 4E schematically illustrate a method of forming and erasing a reversely magnetized state.
Figure 4B:
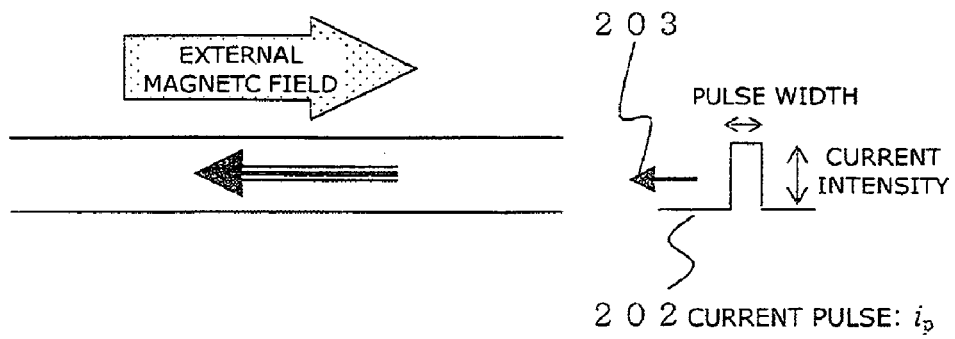
Figure 4C:
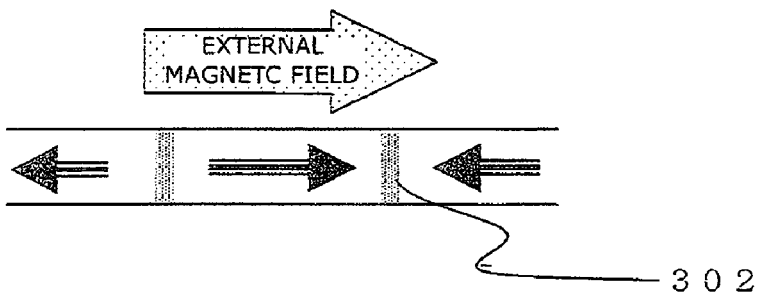
Figure 4D:
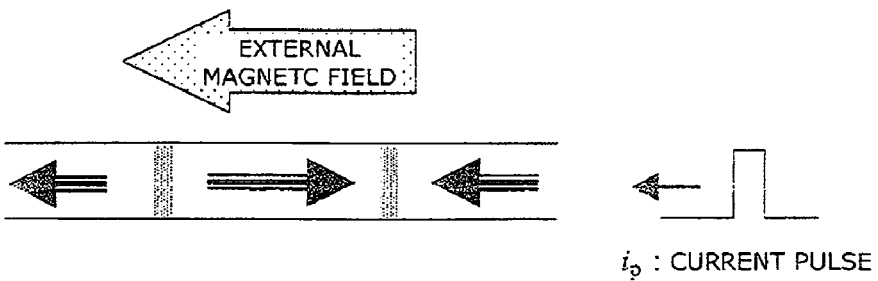
Figure 4E:
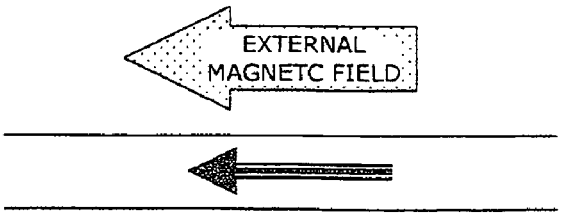
Figure 5A:
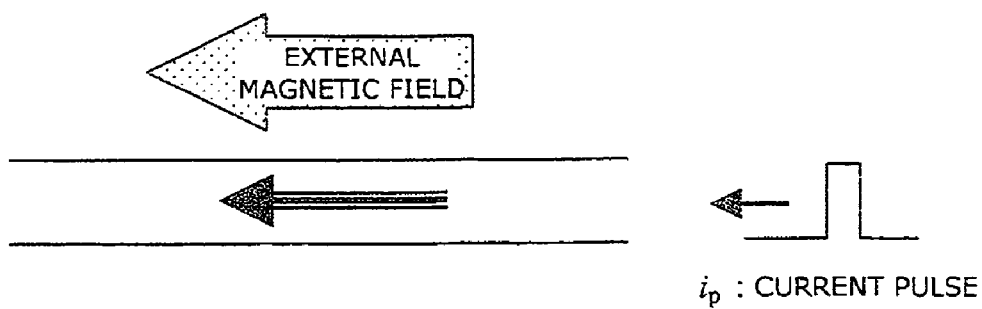
FIGS. 5A and 5B schematically show the fact that no change in the magnetization state occurs when the direction of magnetization in a uniformly magnetized state and the direction of external magnetic field coincide with each other, where
Figure 5B:
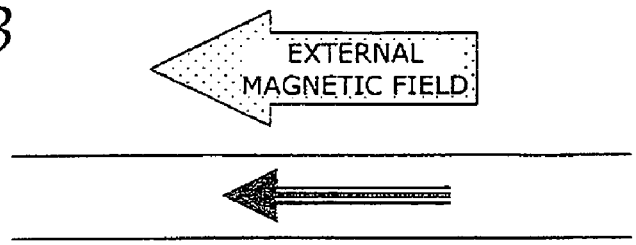

To erase the reversely magnetized structure, it is sufficient to reverse the direction of the external magnetic field 303 applied to the material (FIG. 4D) and supply a current pulse 202 the same as that supplied upon forming the reversely magnetized region (FIG. 4E). When the external field 303 having the direction same as the direction of magnetization is applied, a reversely magnetized region is not formed even if a current pulse having the same intensity and the same pulse width is applied (FIGS. 5A and 5B).

As per the above, the magnetization state can be changed by the external field and the current pulse.

Figure 6:
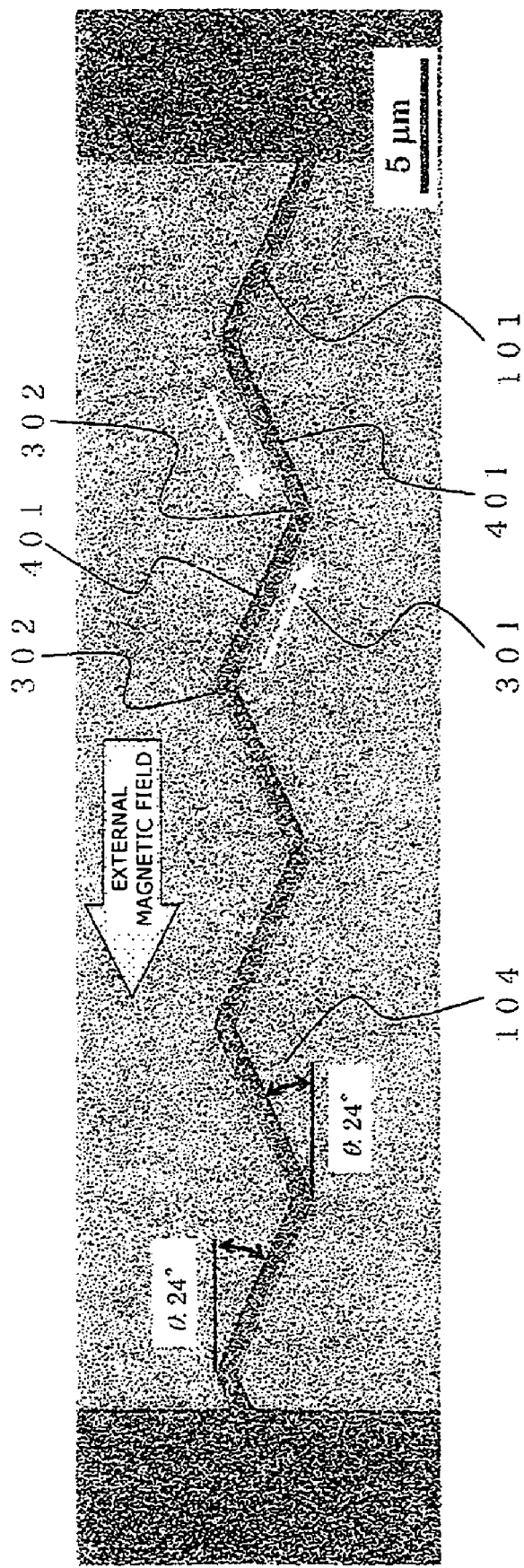
FIG. 6 is an observed image (by Lorentz microscopy) showing an appearance of a ferromagnetic material thin ribbon and the direction of an applied magnetic field.

FIG. 6 is the entire image (Lorentz microscopy image) of the ferromagnetic thin ribbon that was used in the experiment. The ferromagnetic material used in the experiment had a zigzag shape having a plurality of bends. The bend angle at the bends was 24 degrees relative to the longitudinal axis. An external magnetic field directed in the horizontal direction in FIG. 6 was applied to this ferromagnetic material. Thus, the angle formed by the direction of the external magnetic field and the magnetic structure that function as a magnetic information recording element was relatively small. A current pulse was applied in this state. In FIG. 6, the direction of magnetization can be known from the position of black lines 401 at the edges (on the upper and lower side) of the ferromagnetic material. It can be seen from the directions of magnetization in some regions indicated by arrows in FIG. 6 that magnetization reversal had occurred.

In the case where a ferromagnetic material having a zigzag shape is used, it is preferred that the bend angle relative to the longitudinal axis be smaller than 30 degrees. The reason for this is considered to be as follows. Although the principle of operation of the present invention has not been explained theoretically, it is considered that the external magnetic field that contributes to the control of the magnetization state is the component of the external magnetic field that is parallel to the ferromagnetic material (direction a cosine component). Therefore, when the bend angle relative to the longitudinal axis is kept within 30 degrees, the angle formed by the direction of the external magnetic field and the direction of the magnetic material is kept within 30 degrees, and the most part (more than 87%, because cos 30°=0.87) of the external magnetic field contributes to control of magnetization.

Figure 7:
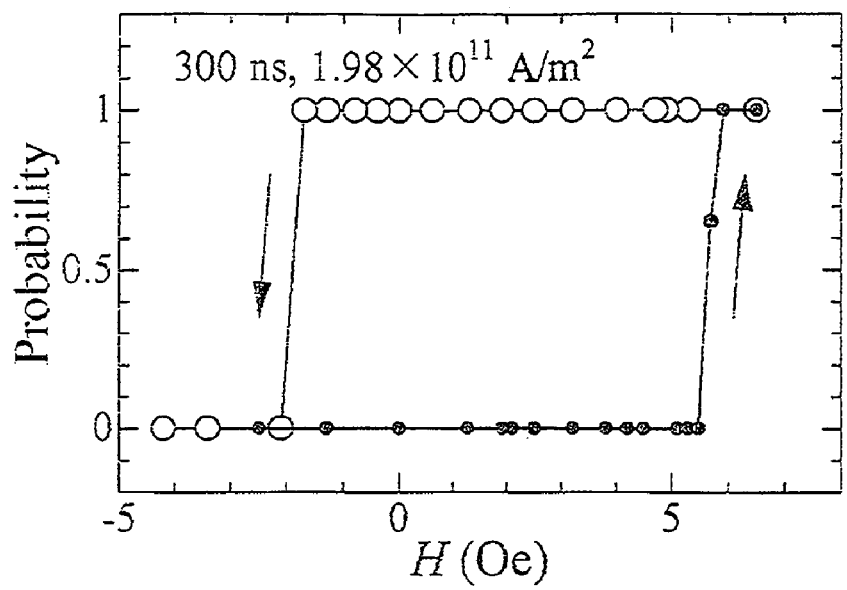
FIG. 7 is a histogram, obtained by an experiment, showing the frequency of formation of the reversely magnetized state in relation to the intensity of the externally applied magnetic field.

FIG. 7 shows changes in the probability of formation of reversely magnetized structure per supply of one current pulse having an intensity of 3 mA (milliampere) and a width of 0.3 μs (micro second) with changes in the intensity of the external magnetic field in the above described experiment. In FIG. 6, the horizontal axis represents the intensity of the magnetic field, where the magnetic field having the direction opposite to the direction of uniform magnetization in the ferromagnetic thin ribbon is expressed by positive values. The result of the experiment clearly shows a hysteresis, and in cases where a magnetic field having an intensity larger than 6 gauss having the direction opposite to the direction of the uniform magnetization is applied, a reversely magnetized region can be formed surely. Furthermore, the reversely magnetized region once formed is not erased even if application of the external magnetic field is ceased or a current pulse is supplied in the state in which no magnetic field is applied. To erase the reversed magnetization reliably, it is necessary to apply a magnetic field (−2 gauss) in the opposite direction and supply a current pulse in this state.

If the intensity and pulse width of the current are changed, a hysteresis like that shown in FIG. 7 exists, on condition that joule heating in the ferromagnetic material does not become unduly large (that is, for example, on condition that the temperature raised by heating does not exceed the Curie temperature). Thus, switching of the magnetization state can be controlled by means of an external magnetic field and a current pulse. The above described experiment was carried out in a cooled condition (at a temperature of 5 K) and at a room temperature (300 K), and it was confirmed that similar hysteresis existed in both the conditions.

Figure 8:
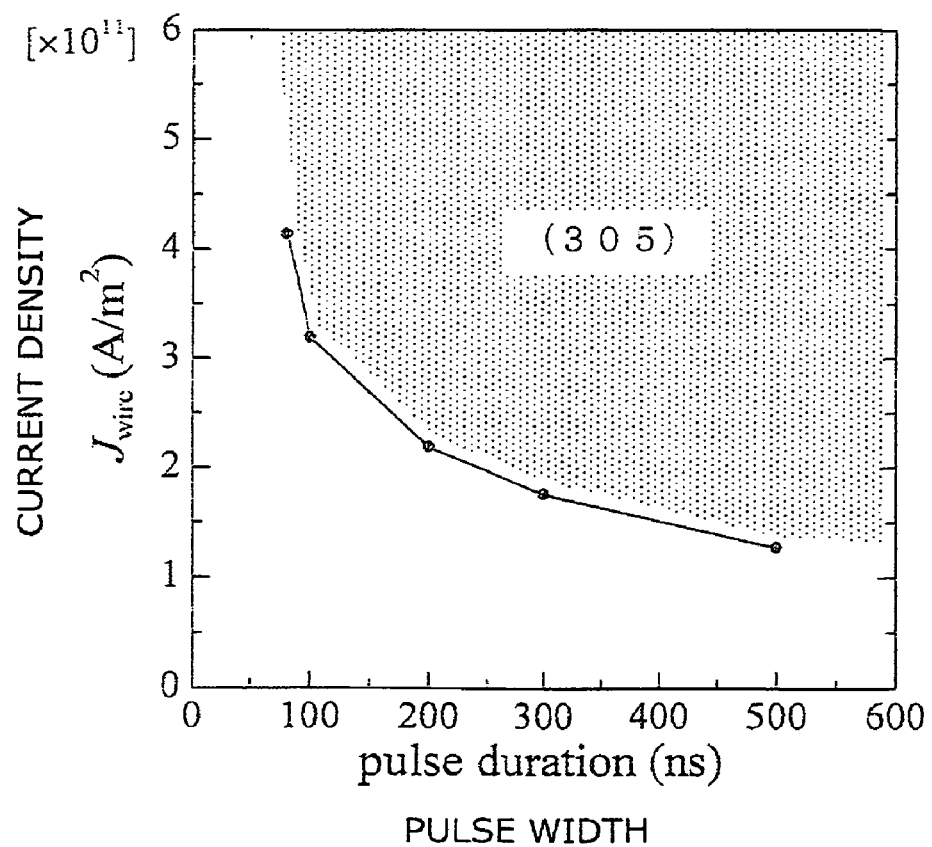
FIG. 8 is a graph, obtained by an experiment, showing the relationship between the intensity and pulse width of a current pulse supplied to a ferromagnetic material with which a reversely magnetized state can be formed.

The current intensity and pulse width of the current pulse to be applied vary depending on the shape (i.e. thickness and width) and material of the ferromagnetic structure. They can be determined by experiments. An example of the range of parameters that are operable for the magnetic material used in the above described experiment is shown in FIG. 8. Any combination of a current density and a pulse width that falls within the hatched area 305 in FIG. 8 can be used to control the magnetization state of the magnetic material. The range of the parameters are not limited to that shown in FIG. 8, but the magnetization state of the magnetic material can be controlled using a current having a current density higher than $8\times10^{10}$ A/m$^2$, more preferably higher than $1\times10^{10}$ A/m$^2$ and a pulse width smaller than 100 µs, more preferably smaller than 1 µs.

<Basic Configuration of the Present Invention>

When the technology of controlling the magnetization state according to the present invention is to be applied to a magnetic information recording device, a ferromagnetic material may be regarded as a magnetic information recording element, and a magnetic field applying means for applying a magnetic field having a predetermined intensity and direction to the ferromagnetic material from outside and current applying means that can supply a current pulse having a predetermined current density and pulse width may be provided. Since the magnetic field is a physical field whose effect generally goes far away while diverging as described before, it is reasonable that an external magnetic field be applied over a relatively large region and control of reversing the magnetization state of each element be performed by a current pulse.

In the following, the basic features concerning the shape of each element and a method of supplying a current pulse will be described first, and then a method of applying an external magnetic field will be described.

First Embodiment

Figure 9:
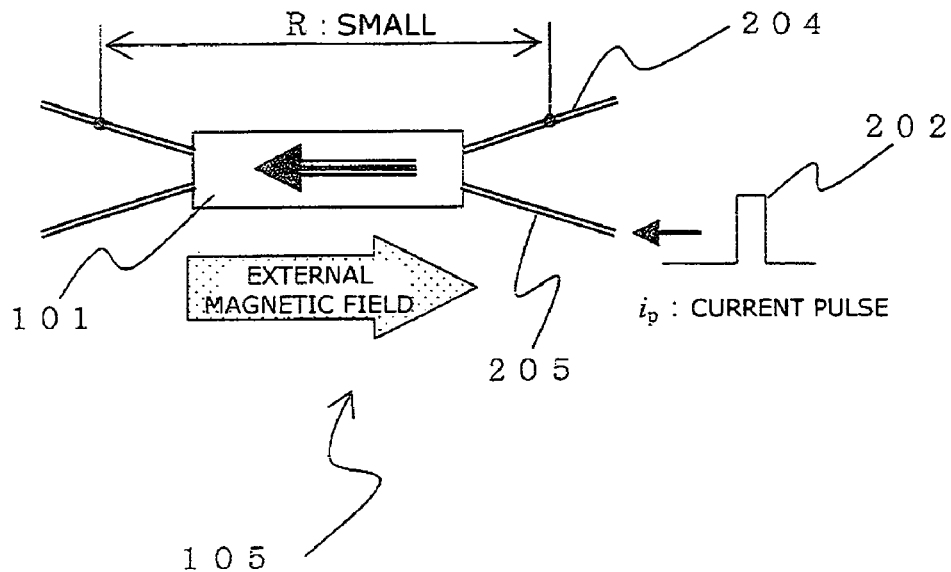
FIG. 9 schematically shows the configuration of a magnetic information recording element according to the present invention.

FIG. 9 shows the basic configuration of a magnetic information recording element to which the present invention is applied. In a magnetic information recording element 105, a pair of supply wires 205 used to supply a current pulse 202 for reversing the magnetization state and a pair of conductive wires 204 used to measure the resistance thereby reading the recorded information are connected to a ferromagnetic material 101. An external magnetic field is applied to this magnetic information recording element by certain means. For example, it is preferred that a coil be provided in the vicinity of the magnetic information recording element, and an induced magnetic field be generated by supplying a current to the coil. The magnetic field application means such as the above mentioned coil and the supply wires 205 used to supply a current pulse correspond to the information writing means for writing information in the magnetic information recording element, and the conductive wires 204 used to measure the value of resistance corresponds to the information reading means for reading information in the magnetic information recording element.

The material used as the ferromagnetic material 101 may be any ferromagnetic material. For example, a single ferromagnetic metal such as iron (Fe), cobalt (Co) or nickel (Ni), or a ferromagnetic alloy such as a Permalloy or Supermalloy may be used.

By controlling the magnetization state of such a magnetic information recording element by an external magnetic field and a current pulse, information recording can be achieved. In this embodiment, since the supply wires 205 through which a current pulse is supplied and conductive wires 204 used to measure the value of resistance are provided separately, they can be operated independently from each other.

Second Embodiment

Figure 10:
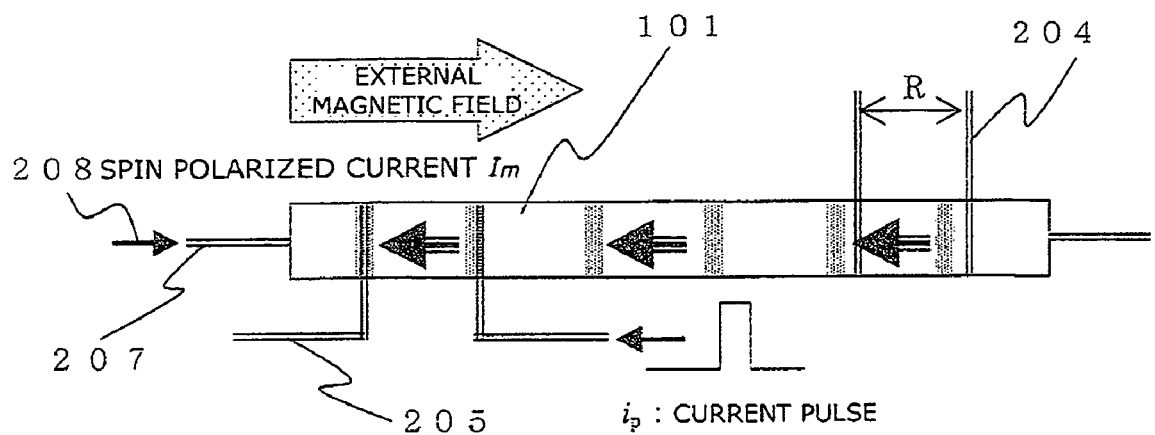
FIG. 10 schematically illustrates an information recording/reading method used in a case in which the present invention is applied to a racetrack memory.

In the following, a description will be made of a case in which the present invention is applied to information writing means for a racetrack magnetic information recording device (see non-patent literature 3 referred to before) shown in FIG. 10, which was recently made public.

The device comprises a ferromagnetic thin ribbon having a sufficient size (length). A pair of conductive wires 205 used to apply a current pulse for generating a magnetic domain structure in the thin ribbon is directly connected to the ferromagnetic thin ribbon. Furthermore, a pair of conductive wires 204 used to read information is also directly connected to the ferromagnetic thin ribbon at positions different from the connection positions of the wires 205 for current pulse application. In addition, conductive wires 207 used to supply a spin polarized current 208 for driving (i.e. displacing) the magnetization state (or the magnetic domain structure) formed in the ferromagnetic thin ribbon are connected to the ferromagnetic thin ribbon, independently from the above described conductive wires 204 and 205. A weak magnetic field can be applied to the ferromagnetic thin ribbon by magnetic field application means.

In this embodiment, the ferromagnetic thin film and the magnetic domain structure (magnetization state) recorded therein are considered to be independent from each other, and the position of the magnetic domain is moved by a spin polarized current 208 as desired. When information writing is to be performed, the position of the magnetic domain into which information is to be written is moved by the spin polarized current 208 to the position adjacent to the conductive wires 205 for information writing, and a current pulse 202 is applied through the conductive wires 205 to thereby control the magnetization state. In other words, information is written/erased by this process. On the other hand, when information reading is to be performed, the position of the magnetic domain from which information is to be read is moved by a spin polarized current to the position adjacent to the conductive wires 204 for information reading, and the value of resistance is measured through the conductive wires 204, whereby the information is read.

Figure 11:
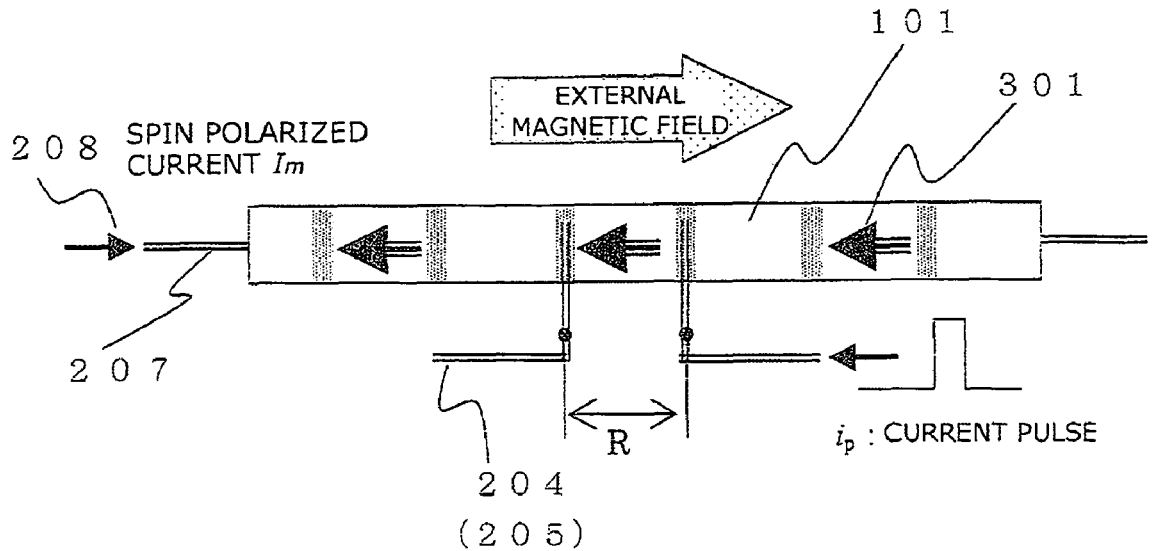
FIG. 11 schematically illustrates an example in which the present invention is applied to a racetrack memory and the same element is used both information recording and information reading.

As shown in FIG. 11, writing and reading of information may be performed through a common pair of conductive wires. This enables, in combination with elimination of local application of a strong magnetic field, a further increase in the integration density of the racetrack magnetic information recording device.

Third Embodiment

Figure 12:
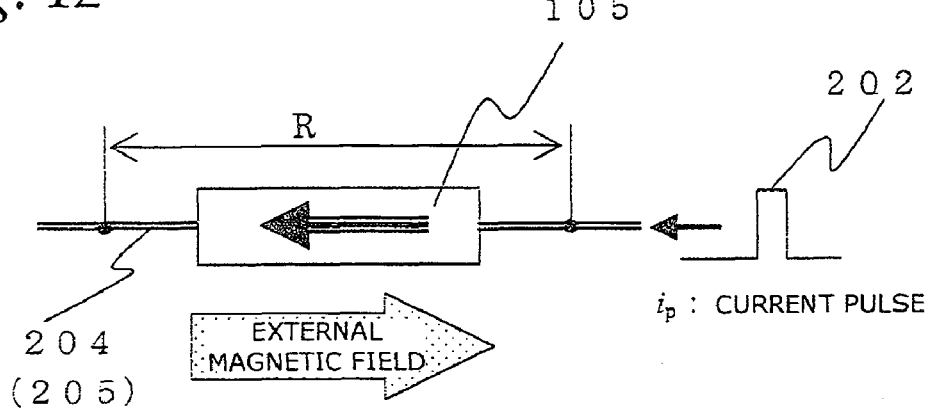
FIG. 12 schematically illustrates an information recording/reading method used in a case in which the present invention is applied to a MRAM memory.

An embodiment in which the present invention is applied to a conventional MRAM magnetic information recording element will be described with reference to FIG. 12. A conventional MRAM has a magneto-resistive element 105 such as a TMR element, magnetic field application means (not shown) for applying a magnetic field to change the magnetization state, and conductive wires 204 used to read recorded magnetic information by measuring the value of resistance of the magneto-resistive element 105.

Since in the MRAM the magnetization state is controlled only by a magnetic field, the magnetic field application means in the MRAM is designed to be able to apply a magnetic field of approximately 100 gauss. In this embodiment, this magnetic field application means is used to apply an external magnetic field of a few gauss. In addition, the conductive wires 204 for information recording are also used to supply a current pulse 202 to write information. In this way, the present invention can be applied to a conventional MRAM configuration to write magnetic information.

Fourth Embodiment

The shape and the structure of the ferromagnetic material that constitutes a magnetic information recording element can be designed in various ways. It is particularly preferred that variations in the shape or other characteristics be introduced so as to make the magnetic domain structure definite.

Figure 13:
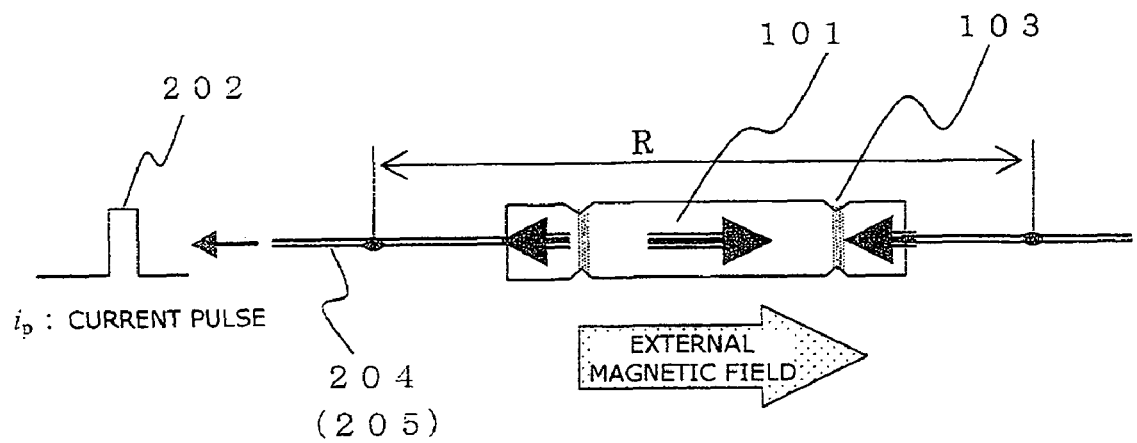
FIG. 13 illustrates an information recording/reading method in an example in which the present invention is applied to a MRAM memory in which the element has variations in the shape (notches).
Figure 14:
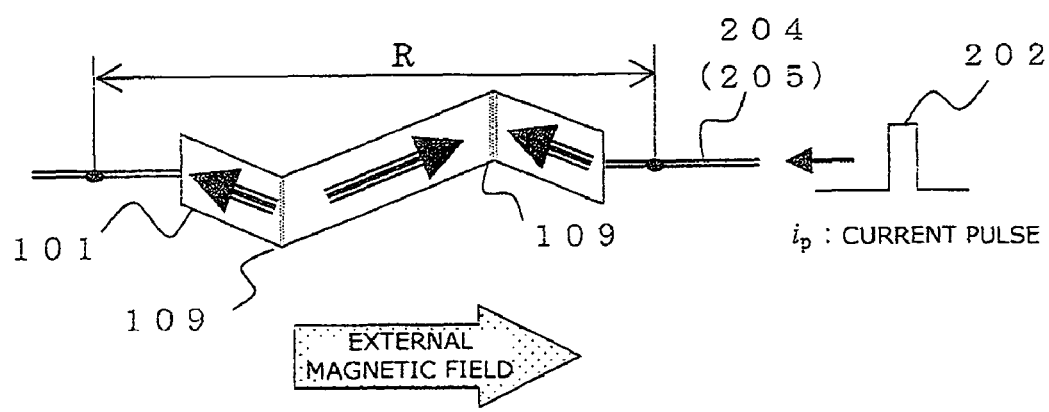
FIG. 14 illustrates an information recording/reading method in an example in which the present invention is applied to a MRAM memory in which the element has variations in the shape (bends).
Figure 15:
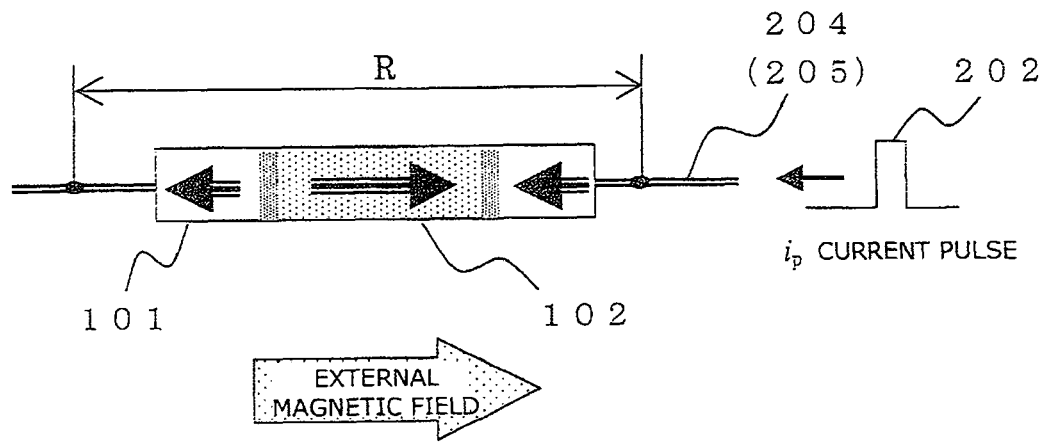
FIGS. 15 and 16 illustrate an information recording/reading method in examples in which the present invention is applied to a MRAM memory in which the element is composed of a plurality of magnetic materials.
Figure 16:
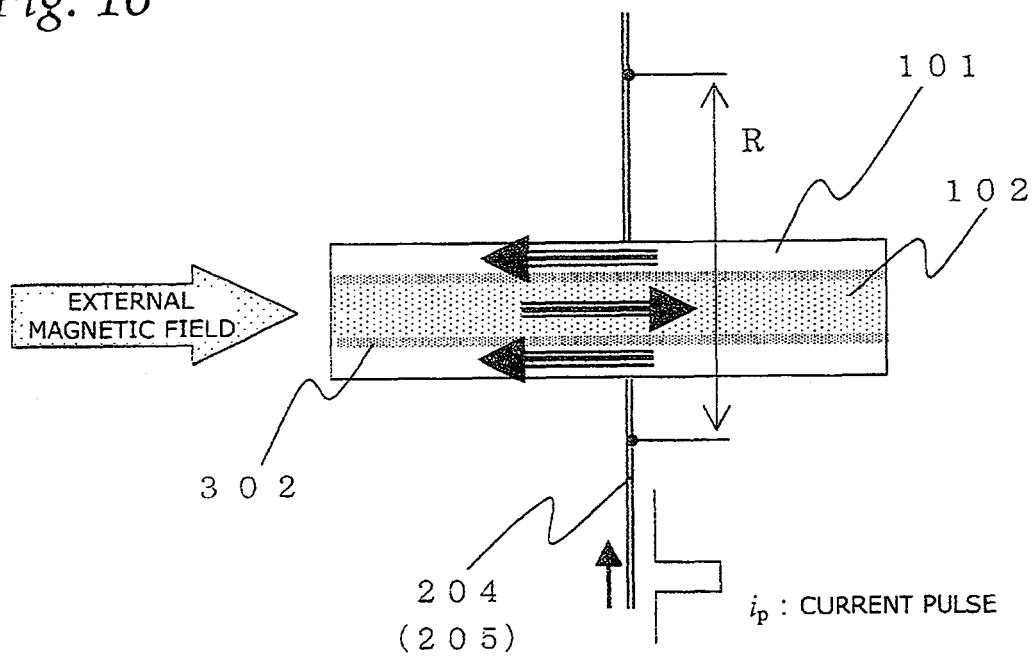

FIGS. 13 and 14 show examples in which the ferromagnetic material 101 of a magnetic information recording element has local variations in the shape. In the case shown in FIG. 13, the ferromagnetic material 101 has notches 103. In the case shown in FIG. 14, the ferromagnetic material 101 has bends 109. FIGS. 15 and 16 show examples in which a magnetic information recording element is composed of a plurality of ferromagnetic materials.

When there are local shape variations in a ferromagnetic material, and in particular, when there are notches 103 as shown in FIG. 13 or bends 109 as shown in FIG. 14, formation of reversely magnetized region is initiated by the notches and bends. Specifically, reversal of magnetic domain structure is likely to occur with magnetic walls being formed at notches or bends. A reversely magnetized structure can be formed in the ferromagnetic material using this effect. Another advantage is that the position of the element that stores magnetic information can be determined definitely. FIGS. 13 and 14 schematically show states after the magnetization state has been reversed by supplying a current pulse.

Similarly, when the ferromagnetic material is partly changed, the boundary of magnetization states and boundary of ferromagnetic materials tend to coincide with each other, since the magnetic permeability varies according to the materials. Spin valves positively use this effect. The same effect can also be used in the magnetic information recording element according to the present invention. FIG. 15 shows a magnetic information recording element composed of two different magnetic materials. The magnetic information recording element as illustrated is in a reversely magnetized state after supply of a current pulse, where only the center magnetic material section is in a reversely magnetized state. The arrangement of the magnetic materials and the direction of the current pulse supply are not relevant to the direction of magnetization of the ferromagnetic material. A plurality of magnetic materials may be arranged in layers as shown in FIG. 16, and the direction of magnetization of the ferromagnetic materials and the direction of flow of the current pulse may be designed to be perpendicular to each other.

The configuration of the element is not limited to those shown in FIGS. 13 to 16, but various configurations may be adopted. In this embodiment, the same conductive wires serve as both conductive wires 205 for supplying current pulses for information writing and conductive wires 204 for measuring the value of resistance for information reading as is the case with the third embodiment. However, the various configurations of the elements described in connection with the fourth embodiment may also be adopted in elements like that in the first embodiment in which the above mentioned different types of conductive wires are provided separately, as will be readily understood.

Fifth Embodiment

Figure 17:
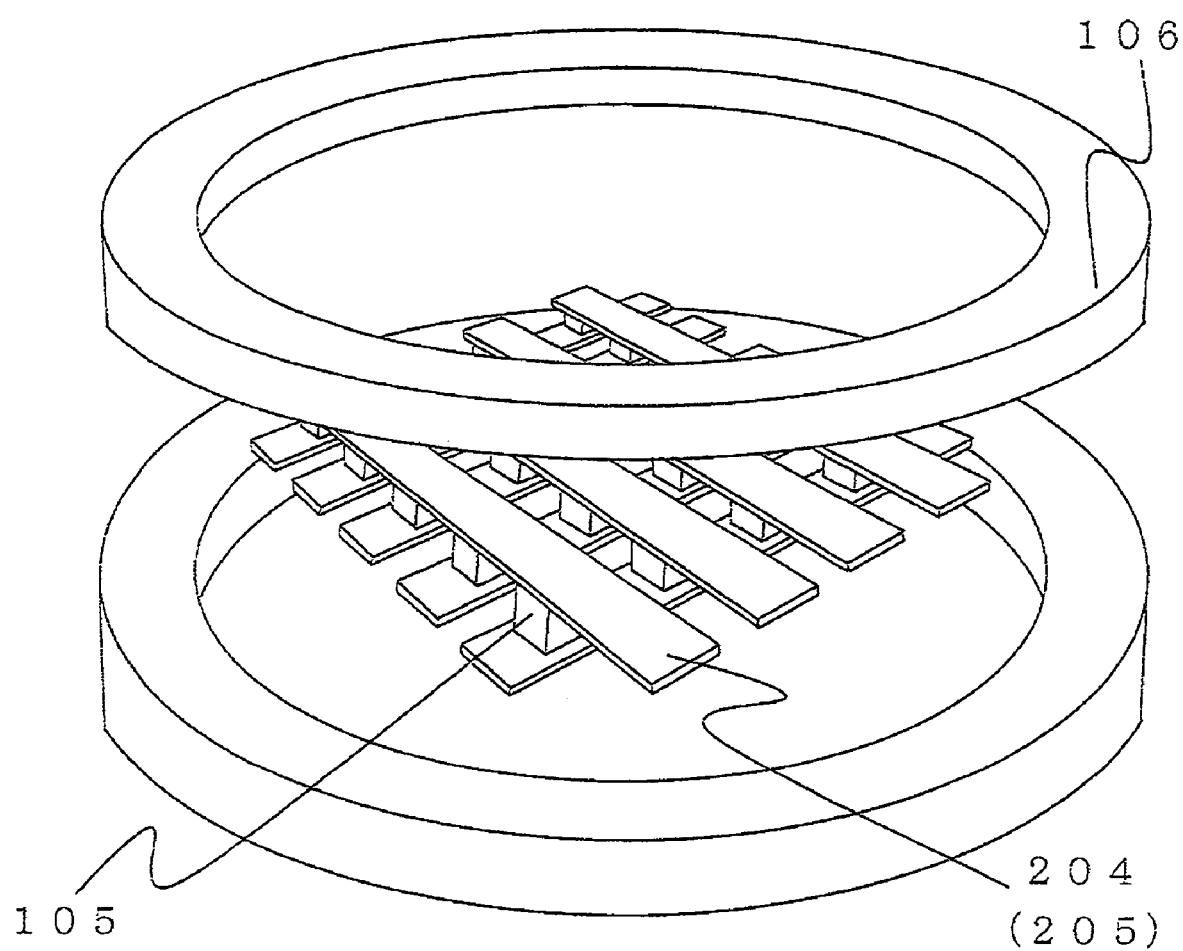
FIG. 17 schematically shows the basic configuration of a magnetic information recording device according to the present invention in which an external magnetic field is applied perpendicularly to the plane in which elements are arranged.
Figure 18:
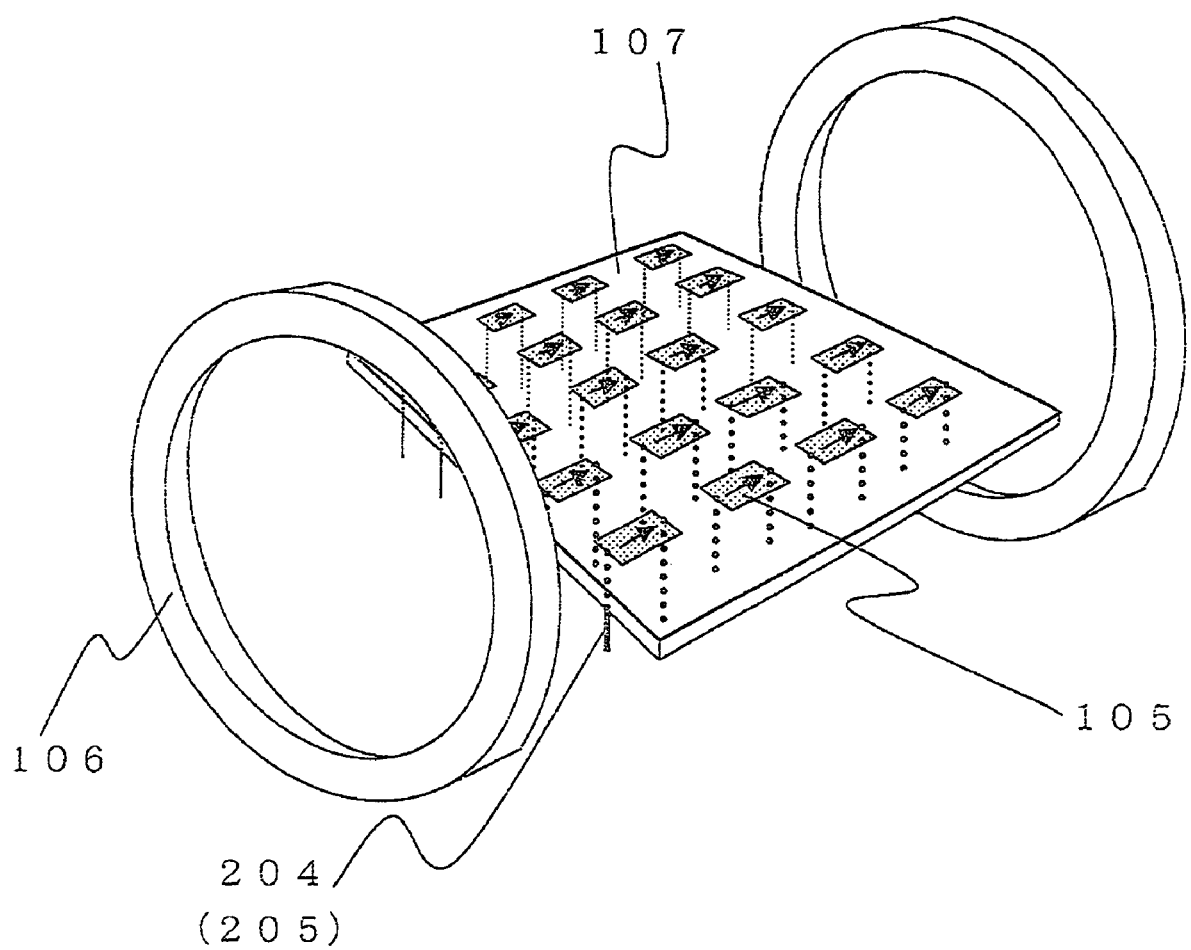
FIG. 18 schematically shows the basic configuration of a magnetic information recording device according to the present invention in which an external magnetic field is applied horizontally to the plane in which elements are arranged.

In a magnetic information recording device according to a fifth embodiment, a plurality of magnetic recording elements are integrated. FIGS. 17 and 18 schematically show the basic configuration of the magnetic recording device according to this embodiment. An the magnetic information recording device according to this embodiment, ferromagnetic material elements 105 are arranged in a matrix pattern in a plane whereby a high integration density is achieved.

FIG. 17 shows a case in which electrical wires to the elements are arranged above and below the aforementioned plane. The direction in which the electrical lines above the plane extend and the direction in which the electrical lines below the plane extend are perpendicular to each other. This configuration is the same as typical recording devices. Coils 106 for applying an external magnetic field are provided above and below the plane of the ferromagnetic material elements. FIG. 18 shows a case in which the ferromagnetic material elements are magnetized in directions within the plane in which the elements are arranged. In the case of this configuration, coils 106 for applying an external magnetic field is provided on both sides of the array of elements arranged in the plane.

In both the cases, a predetermined current is supplied to the pair of coils 106 to apply a magnetic field to the elements, and a current pulse is supplied to specific elements to reverse the magnetization of these elements. Thus, information is recorded. Magnetic reversal occurs in the specific elements, among the elements to which the external field is applied, to which a current pulse is supplied. If the current pulse is supplied to a plurality of elements simultaneously, the magnetization states of the plurality of elements can be changed at the same time. Since the magnetic field is applied to all the ferromagnetic material elements by only a pair of coils, it is not necessary to provide magnetic field application means separately for each element. Therefore, it is possible to achieve a high degree of integration.

Although in the examples shown in FIGS. 17 and 18 coils are used to apply an external magnetic field, other means, such as a permanent magnet, may be used insofar as the intensity and direction of the magnetic field can be controlled.

The magnetization directions of the ferromagnetic material elements are perpendicular to the plane in which the elements are arranged in the case of FIG. 17 and parallel to the plane in which the elements are arranged in the case of FIG. 18. However, these features are not essential to the present invention at all. Furthermore, although the shape of the elements illustrated in FIGS. 17 and 18 is similar to common recording devices, the shape of the element is not limited to this. The present invention can be applied to elements having a shape similar to racetrack magnetic information recording devices.

Sixth Embodiment

The basic configuration of the magnetic information recording device according to the present invention has been described in the foregoing. Application of a magnetic field to each element can be implemented in various manners. It is particularly important that the direction and intensity of the magnetic field be changed locally in a short time, in order to increase the degree of freedom of access to each element, improve convenience of use of the device and improve the operation speed in, for example, information recording/erasing.

Figure 19:
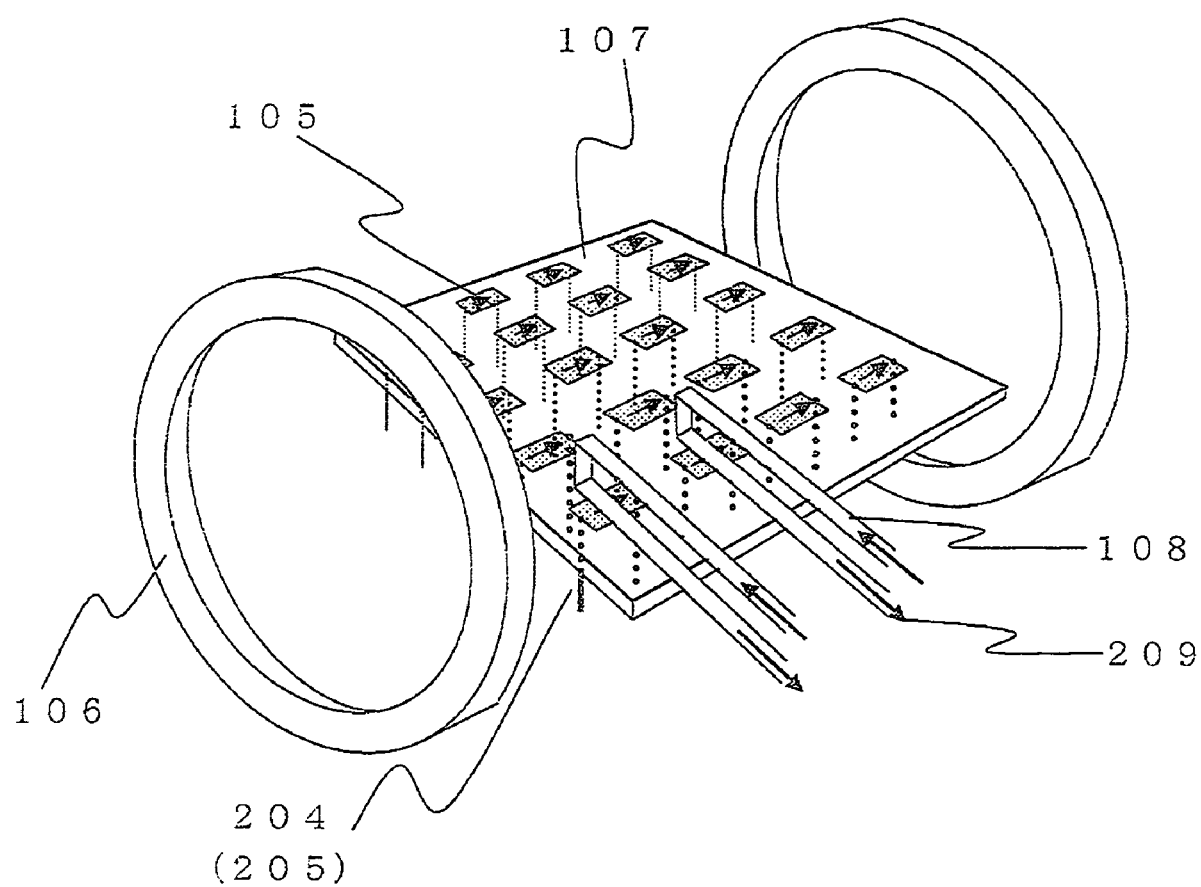
FIG. 19 schematically shows the basic configuration of a magnetic information recording device according to the present invention in which an external magnetic field is controlled individually for each element.

FIG. 19 shows an exemplary method. In order to apply and control an external magnetic field, a conductive wire 108 (second magnetic field application means) is provided in the vicinity of each of the ferromagnetic material elements in addition to a pair of coils 106 (first magnetic field application means) that applies a magnetic field to all the ferromagnetic material elements. An external magnetic field having a prescribed intensity and direction is applied to a specific element by an induced magnetic field generated by current supply to the conductive wire 108. In the example shown in FIG. 19, the conductive wire 108 constitutes a coil having a winding number of 0.5. Although only two of the conductive wires 108 disposed in the vicinity of the elements are illustrated to facilitate understanding of the positional relationship of the wires and the elements, the conductive wires 108 are provided for all the elements when they are actually implemented, as will be readily understood. It should be noted that similar simplification of illustration will be made also in the drawings that will be referred to in the following.

The pair of bilaterally symmetrical coils 106 arranged perpendicularly to the plane in which the elements are arranged can be used to apply a uniform magnetic field in order to make the magnetic field applied to all the elements uniform or to allow the magnetic fields generated and controlled by the conductive wires to be made weak.

For example, if the coils 106 are designed to apply a magnetic field slightly weaker than the intensity required to cause magnetization reversal to occur (that is, for example in the case shown in FIG. 7, approximately 4 gauss), the magnetic field applied by the conductive wire 108 when the magnetization is to be reversed can be made weak, and therefore control can be performed in a short time. In addition, Joule heat generated from the conductive wire 108 can be made small.

Furthermore, if, for example, the coils 106 are designed to apply a magnetic field having a direction opposite to the direction of magnetic field necessary for magnetization reversal, the conductive wire 108 is required, in order to cause magnetization reversal to occur, to apply a stronger magnetic field. In other words, magnetization reversal will not occur with application of a weak magnetic field, and therefore, malfunction can be prevented from occurring.

The magnetic field applied by the coils 106 may be used, for example, to eliminate influences of external magnetic fields such as the geomagnetic field, and the magnetic field for magnetization reversal may be entirely applied by the conductive wires 108.

Batch deletion of information recorded in the entire device can be performed by applying a magnetic field to all the elements by the coils 106 and, in addition, supplying a current pulse to all the elements.

Seventh Embodiment

Figure 20:
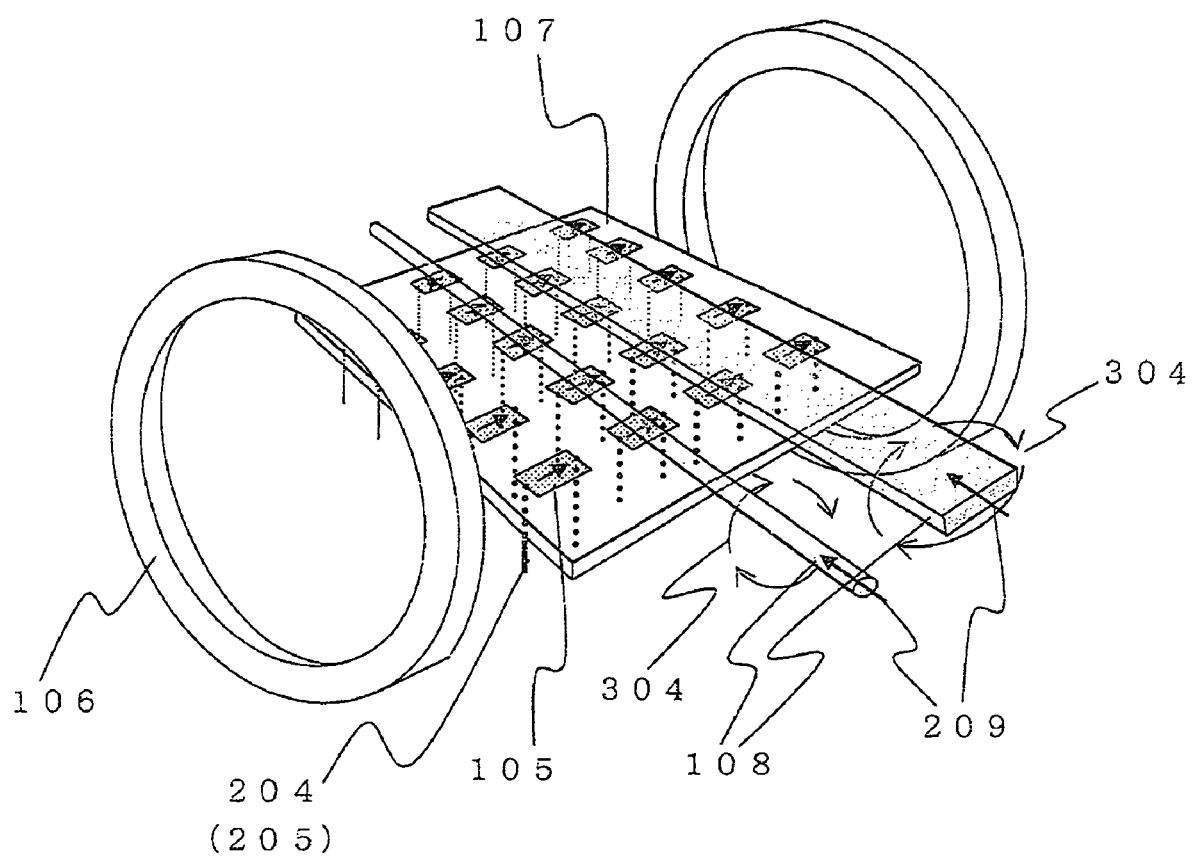
FIG. 20 schematically shows the basic configuration of a magnetic information recording device according to the present invention in which an external magnetic field applied to elements is controlled using straight conductive wires (the conductive wires being parallel to the plane in which the elements are arranged).

While in the sixth embodiment the conductive wire 108 is provided separately for each element, in this seventh embodiment a conductive wire 108 is designed to apply a magnetic field to a plurality of elements. FIG. 20 shows the configuration of a magnetic information recording device according to the seventh embodiment. As shown in FIG. 20, straight conductive wires 108 are arranged in parallel to the plane in which elements are arranged, and each conductive wire 108 can apply an external magnetic field simultaneously to the plurality of elements located just below it. Thus, control of a magnetic field applied to a plurality of elements can be performed at the same time. In FIG. 20, a straight conductive wire having a large width is illustrated. This schematically shows a conductive wire that applies an external magnetic field to multiple rows of elements taking advantage of the width of the conductive wire. As to how the coils 106 provided on both sides of the array of the elements are used, the discussions in the sixth embodiment apply also to the seventh embodiment.

As per the above, by using the coils 106 that apply a magnetic field to all the elements and the conductive wires 108 each of which applies a magnetic field to a part of and plurality of elements, the advantageous effects same as those of the above described sixth embodiment can be achieved. Furthermore, the number of conductive wires 108 can be reduced, and therefore a higher degree of integration can be achieved.

Eighth Embodiment

Figure 21:
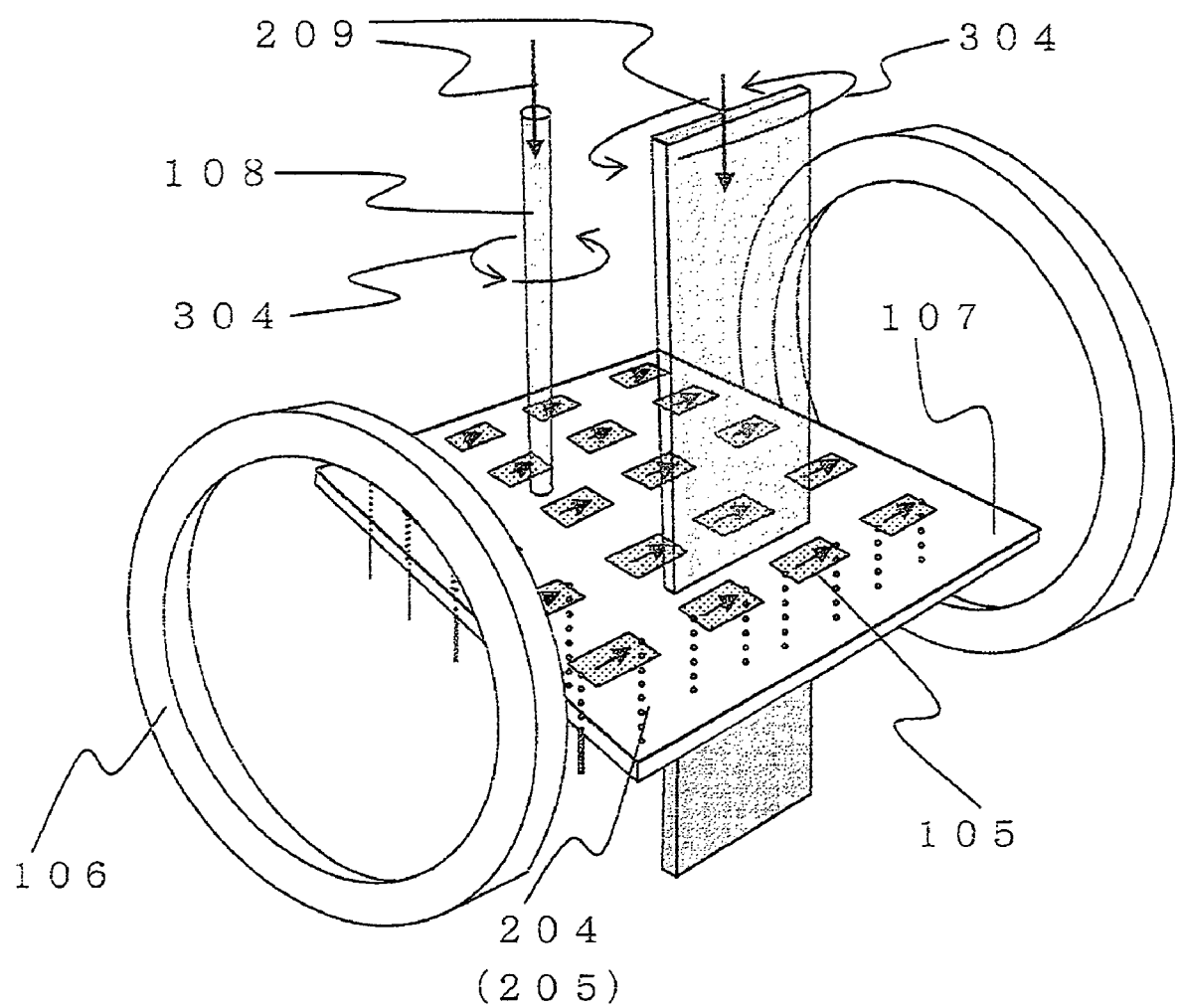
FIG. 21 schematically shows the basic configuration of a magnetic information recording device according to the present invention in which an external magnetic field applied to elements is controlled using straight conductive wires (the conductive wires being perpendicular to the plane in which the elements are arranged).

In the eighth embodiment, a conductive wire 108 that applies a magnetic field to a part of ferromagnetic material elements are arranged to be perpendicular to the plane in which the ferromagnetic material elements are arranged. FIG. 21 shows the configuration of a magnetic information recording device according to this embodiment. FIG. 21 also illustrates a conductive wire having a large width that can apply a magnetic field to a plurality of elements simultaneously, as with the seventh embodiment. The other features such as the operation principle of the element and how to use coils for applying an external magnetic field are the same as those in the sixth and seventh embodiments (shown in FIGS. 19 and 20).

A control method by which both recording and erasing operations can be achieved at the same time will be described with reference to FIG. 21. When a current is supplied to a conductive wire 108, a circular induced magnetic field 304 is generated around the conductive wire 108. This means that the direction of the magnetic field 304 generated on one side of the conductive wire 108 is opposite to the direction of the magnetic field 304 generated on the opposite side of the conductive wire 108. Therefore, if a current pulse can be supplied to a plurality of elements as described in the description of the fifth embodiment, both the recording operation and erasing operation can be achieved simultaneously on one and the opposite sides of the conductive wire.

Furthermore, in cases where a plurality of such conductive wires are used, a magnetic field directed in various directions can be locally applied as a result of synthesis of the induced magnetic field thus generated (though the directions of the magnetic field are limited within a plane in the arrangement shown in FIG. 21). In the case where magnetic fields on one and the opposite sides of a conductive wire are used, a high degree of freedom in magnetic field application can be achieved more easily if magnetization reversal in an element occurs symmetrically in the positive and negative direction with respect to the external magnetic field intensity (in other words, if the element has a symmetrical hysteresis with respect to the vertical axis in FIG. 7). Thus, in this case, it is preferred that the coils for applying an external magnetic field be used for the purpose of canceling an external magnetic field such as the geomagnetic field that is constantly applied to the plane of the elements rather than applying a uniform external magnetic field, unlike with the above described case.

Ninth Embodiment

Figure 22:
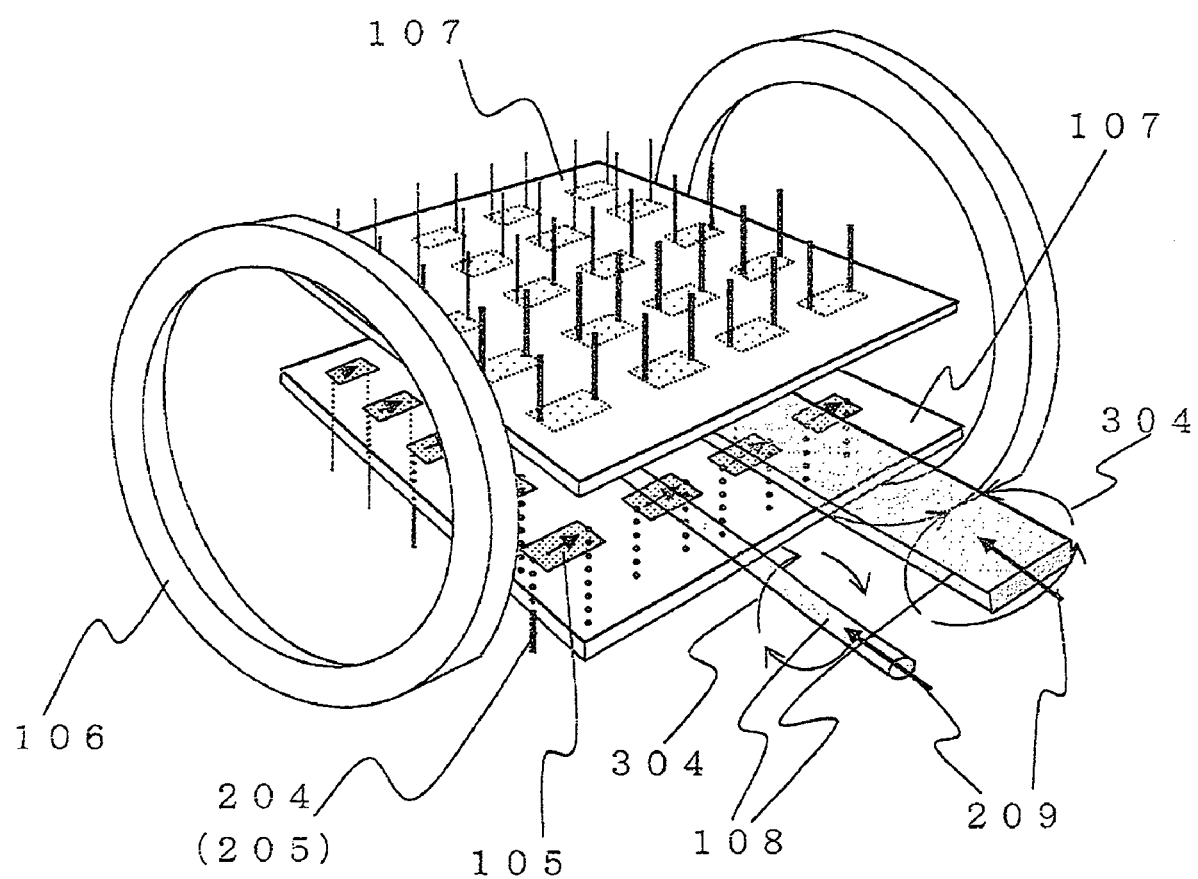
FIG. 22 schematically shows the basic configuration of a magnetic information recording device according to the present invention in which an external magnetic field applied to elements is controlled using conductive wires provided between element arrays arranged one above the other.
Figure 23:
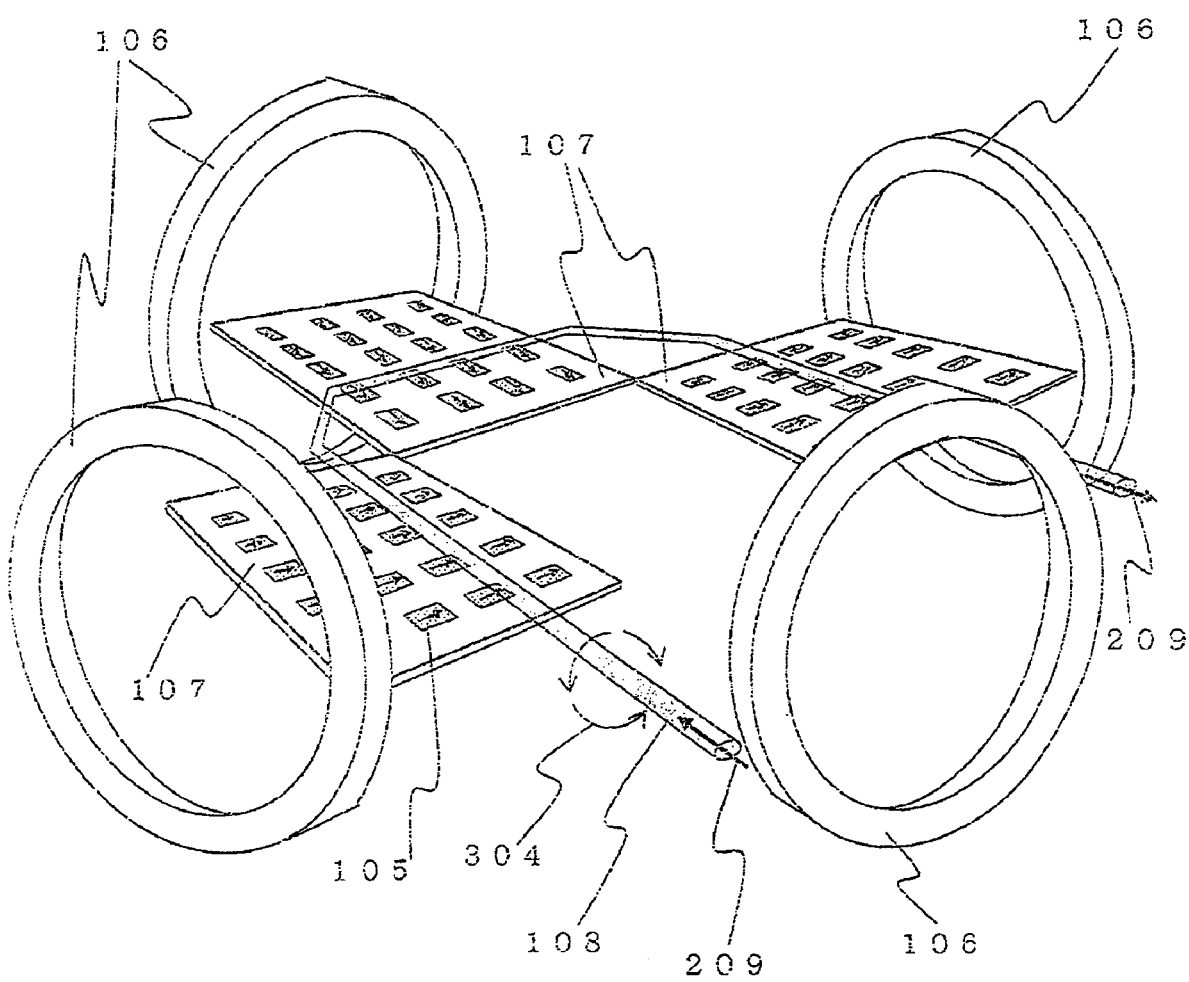
FIG. 23 schematically shows the basic configuration of a magnetic information recording device according to the present invention in which an external magnetic field applied to elements is controlled using conductive wires provided between element arrays arranged side by side.

In the ninth embodiment, there are multiple arrays of ferromagnetic material elements. FIGS. 22 and 23 show the configuration of magnetic information recording devices according to the ninth embodiments. In the configuration shown in FIG. 22, the element arrays are arranged one above the other along the vertical direction. In the configuration shown in FIG. 23, the element arrays arranged side by side in horizontal directions.

In the configuration shown in FIG. 22, external magnetic fields applied to the upper element array and the lower element array are controlled using conductive wires 108 provided between the element arrays, and accordingly the direction of the induced magnetic field applied to the upper element array is opposite to the direction of the induced magnetic field applied to the lower element array. Therefore, both the recording operation and erasing operation can be achieved simultaneously for the elements in the upper element array and the elements in the lower element array, in a similar manner as descried in the description of the eighth embodiment. If these different operations are not desired to be performed simultaneously, the direction of magnetization in the elements in one element array may be made opposite to that of the elements in the other element array.

In the configuration shown in FIG. 23, the external magnetic field applied to horizontally arranged three element arrays is controlled using a conductive wire that extends in a U-shape above the plane of the elements. This embodiment shows that the external magnetic field is not necessarily applied along one direction, but can be applied in multiple directions. In such cases, a plurality of means for applying an external magnetic field may be provided like in the configuration shown in FIG. 21, which makes the configuration simpler.

If the configuration according to the eighth embodiment shown in FIG. 21 is modified in such a way that multiple arrays of ferromagnetic material elements are arranged one above another with conductive wires being arranged to vertically pass through them in order to control the external magnetic field locally in a short time, though not shown in the drawings, the function described in connection with the ninth embodiment can also be realized, as will be easily understood by analogy.

INDUSTRIAL APPLICABILITY

The present invention has been made with a view to apply a physical phenomenon that was discovered by experiments to a magnetization state control device such as a magnetic information recording device. According to the present invention, formation/deletion of reversed magnetization is controlled by two physical operations, namely application of an external magnetic field and application of a current pulse. Each of these two physical operations concerning magnetic field and current pulse includes two parameters, namely the intensity and direction of the magnetic field, and the current amount and pulse width of the current pulse. This will possibly provide more fine control. The method can be used as a main operation method for spintronics elements that are intensively developed in the world now and the device according to the present invention can be used as a main memory device.

What is claimed is:

1. A magnetization state control device that controls a magnetic state of a magnetic material, comprising:
   magnetic field applying means for applying a magnetic field to said magnetic material; and
   current applying means for applying a current pulse to said magnetic material, wherein
   the magnetic state of said magnetic material is controlled by applying a current pulse to said magnetic material while applying a magnetic field thereto so that electric current flowing directly through the magnetic material controls magnetization direction.

2. A magnetization state control device according to claim 1, wherein the magnitude of the magnetic field applied by said magnetic field applying means is larger than the magnitude of a magnetic field substantially constantly existing in the device and smaller than the magnitude of a magnetic field that is needed to change the magnetization state of said magnetic material only by the magnetic field.

3. A magnetization state control device according to claim 1, wherein the magnetization state control device controls magnetization states of a plurality of magnetic materials, said magnetic field applying means applies a magnetic field to substantially all of the plurality of magnetic materials, and said current applying means applies a current to each magnetic material.

4. A magnetization state control device according to claim 3, wherein said magnetic field applying means comprises first magnetic field applying means for applying a magnetic field to substantially all the magnetic materials and a plurality of second magnetic field applying means each for applying a magnetic field to a portion of the magnetic materials with which it is associated.

5. A magnetization state control device that controls a magnetic state of a magnetic material, comprising:
   magnetic field applying means for applying a magnetic field to said magnetic material;
   current applying means for applying a current pulse to said magnetic material;
   wherein the magnetic state of said magnetic material is controlled by applying a current pulse to said magnetic material while applying a magnetic field thereto; and
   wherein the magnitude of the magnetic field applied by said magnetic field applying means is larger than the magnitude of a magnetic field constantly existing in the device and smaller than the magnitude of a magnetic field that is needed to change the magnetization state of said magnetic material only by the magnetic field.

6. A magnetization state control device that controls a magnetic state of a magnetic material, comprising:
   magnetic field applying means for applying a magnetic field to said magnetic material;
   current applying means for applying a current pulse to said magnetic material;
   wherein the magnetic state of said magnetic material is controlled by applying a current pulse to said magnetic material while applying a magnetic field thereto; and
   wherein the magnetization state control device controls magnetization states of a plurality of magnetic materials, said magnetic field applying means applies a magnetic field to all of the plurality of magnetic materials, and said current applying means applies a current to each magnetic material.

7. A magnetization state control device according to claim 6, wherein said magnetic field applying means comprises first magnetic field applying means for applying a magnetic field to all the magnetic materials and a plurality of second magnetic field applying means each for applying a magnetic field to a portion of the magnetic materials with which it is associated.

8. A magnetic information recording device comprising:
   a magnetic information recording element;
   information writing means including magnetic field applying means for applying a magnetic field to said magnetic information recording element and current applying means for applying a current pulse to said magnetic information recording element, for writing magnetic information into said magnetic information recording element by applying a current pulse to it while applying a magnetic field to it, so that electric current flowing directly through magnetic material of the magnetic information recording element controls a magnetization direction of the magnetic material; and information reading means for reading information recorded in said magnetic information recording element.

9. A magnetization state control device that controls a magnetic state of a magnetic material, comprising:

at least a coil or a permanent magnet for generating a magnetic field that applies the magnetic field to said magnetic material;

at least a conductor for supplying a current pulse that is applied to said magnetic material; and wherein the magnetic state of said magnetic material is controlled by applying a current pulse to said magnetic material while applying a magnetic field thereto so that electric current flowing directly through the magnetic material controls magnetization direction.

* * * * *